(12) United States Patent
Treffert et al.

(10) Patent No.: US 11,035,398 B2
(45) Date of Patent: Jun. 15, 2021

(54) VENT

(71) Applicant: W.L. Gore & Associates GmbH, Putzbrunn (DE)

(72) Inventors: Günter Treffert, Putzbrunn (DE); Peter Kroker, Putzbrunn (DE); Johannes Stangl, Putzbrunn (DE); Björn Roth, Putzbrunn (DE)

(73) Assignee: W. L. Gore & Associates GmbH, Putzbrunn (DE)

( * ) Notice: Subject to any disclaimer, the term of this patent is extended or adjusted under 35 U.S.C. 154(b) by 222 days.

(21) Appl. No.: 16/094,053

(22) PCT Filed: Apr. 7, 2017

(86) PCT No.: PCT/EP2017/058325
§ 371 (c)(1),
(2) Date: Oct. 16, 2018

(87) PCT Pub. No.: WO2017/182290
PCT Pub. Date: Oct. 26, 2017

(65) Prior Publication Data
US 2020/0325928 A1    Oct. 15, 2020

(30) Foreign Application Priority Data

Apr. 18, 2016 (EP) .................................. 16165796

(51) Int. Cl.
*F16K 24/04* (2006.01)
*F16B 23/00* (2006.01)
(Continued)

(52) U.S. Cl.
CPC ........ *F16B 23/0007* (2013.01); *F16B 33/004* (2013.01); *F16F 1/18* (2013.01)

(58) Field of Classification Search
CPC ...................................................... F16K 24/04
(Continued)

(56) References Cited

U.S. PATENT DOCUMENTS

| 4,902,423 A | 2/1990 | Bacino |
| 5,215,312 A | 6/1993 | Knappe et al. |

(Continued)

FOREIGN PATENT DOCUMENTS

| CN | 104080291 A | 10/2014 |
| DE | 38 17 227 A1 | 11/1989 |

(Continued)

OTHER PUBLICATIONS

International Search Report and Written Opinion from International Application No. PCT/EP2017/058325 dated Sep. 15, 2017.

*Primary Examiner* — Paul J Gray
(74) *Attorney, Agent, or Firm* — Greenberg Traurig, LLP

(57) ABSTRACT

A vent, preferably made of metal, comprises a body (10) having an aperture (24) for the passage of a fluid and a sealing surface (11) surrounding the aperture. A porous membrane (50) lies against the sealing surface (11) and covers the aperture (24). A clamp arrangement may comprise a spring (30) pressing the membrane against the sealing surface (11) to prevent liquid from passing through between the sealing surface (11) and the membrane (50), e.g. by means of a cap (40) secured to the body (10) of the vent. The clamp arrangement is such that upon a reduction of the membrane thickness by 50% in the clamping area the compressive force per unit area does not change by more than 50%.

10 Claims, 4 Drawing Sheets

(51) Int. Cl.
*F16B 33/00* (2006.01)
*F16F 1/18* (2006.01)

(58) Field of Classification Search
USPC .................................. 137/197–200
See application file for complete search history.

(56) References Cited

U.S. PATENT DOCUMENTS

| | | | |
|---|---|---|---|
| 7,357,709 B2* | 4/2008 | Zukor | G03B 17/02 |
| | | | 454/270 |
| 8,881,931 B2 | 11/2014 | Chiu | |
| 2005/0227610 A1 | 10/2005 | Zukor et al. | |
| 2006/0076063 A1* | 4/2006 | Perry | F02M 25/0836 |
| | | | 137/554 |
| 2013/0032219 A1* | 2/2013 | Heim | H01M 2/1264 |
| | | | 137/14 |
| 2014/0227960 A1 | 8/2014 | Ishii et al. | |

FOREIGN PATENT DOCUMENTS

| | | |
|---|---|---|
| DE | 9107992 U1 | 1/1992 |
| DE | 20 2012 003607 U1 | 7/2013 |
| EP | 417344 A1 | 3/1991 |
| EP | 1 740 861 B1 | 11/2008 |
| JP | 2002185156 A | 6/2002 |
| JP | 2007141629 A | 6/2007 |
| JP | 2009 264433 A | 11/2009 |
| JP | 2010-052701 A | 3/2010 |
| JP | 2012-169181 A | 9/2012 |
| JP | 2012-231088 A | 11/2012 |
| WO | 2015/154996 A1 | 10/2015 |

* cited by examiner

VENT

RELATED APPLICATIONS

The present application is a national phase filing under 35 USC 371 of International Application No. PCT/EP2017/058325, filed on Apr. 7, 2017, which claims the priority of European Patent Application No. 16165796.0, filed on Apr. 18, 2016, the entire contents and disclosures of which are hereby incorporated by reference.

BACKGROUND

Vents find use in many applications. For example, in the automotive industry vents are used in electrical component housings, gear housings, brake housings and even vehicle bodies to equalize pressure between the housing or body interior and the surrounding environment. In other applications, the function of the vent is not bulk flow for pressure equalization, but diffusion for the purpose of transporting select components through the medium, such as the diffusion of water through a medium for moisture control. In these types of applications, the driving force is not pressure, but temperature, osmotic pressure, electrostatic attraction or repulsion, or some other driving force. Vents are also used in many other applications, such as electrical and mechanical equipment housings, or chemical containers.

In many applications, vents must not only be gas permeable to allow a pressure equalization, but also be liquid impermeable to seal the interior of a housing from moisture, liquids, or contaminants, which can damage internal equipment or components and corrode the housing. For this purpose, vents may comprise a porous membrane which is gas permeable but impermeable to liquids.

Vents containing a molded polymer or plastic body and a porous membrane formed from polytetrafluoroethylene (PTFE), polypropylene or polyethylene are known from e.g. JP01 269 766. Known polymer vents are used as air vent devices in e.g. a breather value, a filter, a diaphragm device, etc. They typically include a membrane with circumferentially located holes that are positioned between rigid resin portions bound together through the circumferentially located holes. Many other configurations of molded polymer or plastic vents are known.

Where polymer and plastic vents lack sufficient durability, heat resistance and/or chemical resistance, metal vents are employed. Vents having a metallic body, e.g. made from stainless steel, may be used in environments which require the vent to be chemically resistant, have a low corrosion potential, withstand high temperatures and/or temperature ranges as well as ultraviolet (UV) radiation or be mechanically robust. It is known e.g. from U.S. Pat. No. 5,353,949 that metal vents provide improved durability in some applications. In addition, a metal vent provides an electromagnetic shield across the through opening of the housing into which it is mounted.

However, known metal vents rely on some form of sealant, adhesive or gasket to seal the membrane to the vent. These sealants and gaskets are also subject to degradation, and may not be useful at high temperatures. Also, the fixation of the membrane to the metallic body of such vents using glue or other bonding techniques often requires high level know-how which is not always readily available. This is a particular problem where customized membranes are supplied to a vent manufacturer who then fixes the membranes to vent bodies.

It has been proposed in EP 1 740 861 B1 to secure a shell to the vent body using only an interference fit with the membrane being compressed between the shell and the vent body without the use of adherents, welding, brazing and the like, or caulking materials, compression gaskets, springs and the like.

Rather, the interference fit is maintained by the aggregation of internal forces within parts and friction between the parts. The interference fit may include the use of e.g. press fitting and, in particular, snap rings which snap into place. Ridges or other protrusions may be provided in the membrane bearing surfaces to minimize membrane contact and increase compressive force per unit area.

While these vents offer improved properties over polymer vents, further improvements regarding the vent's mechanical, chemical and thermal durability and leak tightness over time are desirable to further enhance the vent's applicability. Thus, a need exists for vents, in particular vents with a metallic body, which overcome the afore-mentioned drawbacks.

SUMMARY OF THE INVENTION

According to a first aspect of the invention, there is provided a vent with the features of independent claim 1. Preferred embodiments thereof are defined in respective dependent claims.

According to a second aspect of the invention, there is provided a kit comprising a porous membrane and a spring element for use in a vent assembly. Preferred embodiments thereof are defined in respective dependent claims.

A vent according to the first aspect of the invention may comprise a body having an aperture for the passage of a fluid, such as gas, a sealing surface surrounding the aperture, a porous membrane covering the aperture and lying against the sealing surface, and a clamp arrangement pressing the membrane against the sealing surface in a clamping area of the membrane.

The purpose of the porous membrane is to allow gas to pass through the membrane e.g. for pressure equalization, but to prevent a liquid from passing through the membrane. Thus, the porous membrane is generally liquid impermeable. In particular, the membrane prevents ingress of water or aqueous solutions which may come into contact with the membrane from outside the container. The purpose of the clamp arrangement by which the membrane is pressed against the sealing surface is to prevent liquid from passing through between the sealing surface and the membrane towards the aperture and vice versa.

According to the first aspect of the invention, the membrane has a certain thickness in the clamping area at standard conditions, i.e. in its compressed state, wherein standard conditions are defined as 20° C., 70% relative humidity and 1,013 bar ambient pressure, whereby the compressing force per unit area in the clamping area of the membrane does not change by more than 50% upon a change of the thickness of the membrane in the clamping area by 50%. Such change can be a decrease of the thickness. Alternatively, such change can be an increase of the thickness. Further alternatively, the vent may be such that it allows for a change of a decrease and an increase of the membrane thickness.

That is, certain membranes, in particular polymeric membranes, have the tendency to move slowly or deform permanently under the influence of mechanical stresses caused by the compressing force. This phenomenon is called "creep" and is sometimes also referred to as "cold flow". Creep is particularly severe in materials that are subject to high temperatures for long periods. Typically, creep would be substantially below 50%, but if creep reaches 50%, then, according to the invention, the compressive force decreases by not more than 50% of the original compressive force. Thus, the initial compressive force would be adjusted at a level which is at least twice as high as the minimum required compressive force, so that the compressive force per unit area does not fall below the minimum required compressive force in the long term, when the thickness of the compressed membrane has decreased to 50% of its original compressed value. Where creep is to be expected to amount to more than 50%, e.g. 75%, of the thickness, the initial compressive force would of course have to be adjusted at an accordingly higher level to compensate for the additional creep as well.

Preferably, upon a 50% thickness reduction of the membrane, the compressive force per unit area does not change by more than 20%, more preferably 10%, and most preferably 5%. This will allow for compensation of any relevant creep over time without a substantial loss of compressive force.

Preferably, the clamp arrangement not only compensates a decrease of the membrane thickness, but likewise allows for an increase of the thickness of the membrane in the clamping area by preferably at least 50%. This is advantageous in order to avoid damage to the membrane when the membrane swells in use, e.g. due to moisture absorption.

The clamp arrangement does not require glue or other bonding techniques to secure the membrane to the vent body, although this is not strictly excluded. Preferably, the membrane is compressed between the clamp arrangement and the sealing surface surrounding the aperture of the vent body only by means of interference fit. As used herein, "interference fit" is intended to encompass all manner of fitting parts in which the assembly is maintained by the aggregation of internal forces within parts and friction between parts without the use of adherents, such as adhesives, or welding, brazing and the like.

The invention is preferably used in metal vents, i.e. vents having a body made of metal, preferably made from stainless steel. However, the invention may likewise be employed with plastic and polymer vents. This is particularly useful in applications where the working conditions are not so challenging but the type of plastic or polymer of the vent body makes it difficult to secure the membrane to the vent body by adherents, welding or brazing. Likewise, the remaining parts of the vent, other than the membrane and a sealing ring, such as an O-ring, are preferably made of metal, more preferably of stainless steel.

Preferably, the clamp arrangement comprises at least one spring element, wherein the spring element is tensioned so as to provide said compressive force. A change of the compressive force depends on the change of the length of the spring:

$$\Delta F = C \cdot \Delta l,$$

where $\Delta F$ is the change of the compressive force, $C$ is the spring constant, and $\Delta l$ is the change of the spring length. Accordingly, when the thickness of a membrane, which is initially compressed to a thickness of e.g. 1 mm, decreases by 50% ($\Delta l$=0.5 mm) to a thickness of 0.5 mm due to creep or increases by 50% ($\Delta l$=0.5 mm) to a thickness of 1.5 mm, then the change of the compressive force and, thus, the change of the force per compressed unit area changes by $$\Delta F = C \cdot 0.5 \text{ mm}$$

or $$\Delta p = \frac{\Delta F}{A} = \frac{C \cdot \Delta l}{A} = \frac{C \cdot 0.5 \text{ mm}}{A}$$

where $\Delta p$ is the change of the compressive force per unit area, and $A$ is the size of the compressed area of the membrane, hereinafter referred to as "clamping area", which usually corresponds to the contact surface area by which the clamp arrangement contacts the membrane.

Thus, by choosing a "soft" spring, i.e. a spring with a low spring constant $C$, the effect of a change of the membrane thickness on the compressive force $F$, e.g. due to creep or swelling, may be kept small. The spring material may consist of or comprise a variety of materials, such as plastics and polymers, silicon, ceramics, and preferably metal. With a spring having a low spring constant, the compressive force per unit area will not be affected much if the membrane thickness decreases due to creep and will likewise not be affected much if the membrane swells due to moisture absorption. Rather, the compressive force provided by the spring element will mainly depend on the spring's initial compression according to the formula $$F = C \cdot x,$$

where $x$ is the initial compression of the spring element.

Preferably, the minimum compressive force per surface area or surface pressure $p$ $$p = \frac{F}{A} = \frac{C \cdot x}{A},$$

is 1 N/mm² or higher in order to achieve sufficient leak tightness, in particular with an ePTFE membrane. The upper limit for the surface pressure $p$ depends on the durability of the membrane material and is preferably not higher than 70 N/mm² in the case of an ePTFE membrane. Typically, the pores of an ePTFE membrane close at a surface pressure of about 30 N/mm² so that the membrane becomes impermeable for gas, but in the present context it is sufficient to achieve liquid tightness, so that a lower surface pressure $p$ is preferable. The preferred surface pressure $p$ is in the range of between 1 and 30 N/mm², more preferably between 1 and 10 N/mm², and most preferably between 1 and 2 N/mm².

Preferably, the ratio $R$ between the spring constant $C$ and clamping area $A$ $$R = \frac{C}{A}$$

is certainly greater than zero and preferably equal to or lower than 50,000 N/m/mm², more preferably equal to or lower than 15,000 N/m/mm², and most preferably equal to or lower than 1,500 N/m/mm². A high value for the ratio $R$, i.e. a relatively small contact area $A$ or a relatively strong spring element with a high spring constant $C$, may be chosen where the surface pressure $p$ resulting from the initial compressive force $F$ is high, e.g. in the case of $p$=30 N/mm². But lower ratios $R$ are preferable.

For instance, if the clamping area $A$ is circular with a medial diameter of 15.9 mm and a width of 0.9 mm, i.e. has the size of about 45 mm², the spring constant $C$ may be chosen at 58,000 N/m, resulting in a surface pressure $p$ of about 1.65 N/mm² and a ratio R of 1,290 N/m/mm². This ratio is particularly suitable with membranes made from expanded polytetrafluoroethylene (ePTFE) having a thickness of between 0.5 and 1.5 mm. However, preferred membrane thicknesses may range up to 2 mm.

The contact surface by which the clamp arrangement, e.g. the spring element, abuts the membrane in the clamping area is preferably relatively large so as to avoid the clamp arrangement cutting into the membrane. A typical minimum contact width is in the range of 0.5 and 1.5 mm.

According to a first preferred embodiment, the clamp arrangement comprises a fastener which is secured to the body of the vent, and the tension of the spring element results from securing the fastener to the body of the vent. In other words, the spring element is compressed between the membrane, which lies against the sealing surface, and the fastener, such as a cap, the fastener being fixed to the body of the vent, e.g. by a snap fit, cooperating threads, gluing, or other means. Preferably, the fastener is secured to the body of the vent by interference fit, such as clipping.

The spring element may be separate from the fastener and clamped between the fastener and the membrane, as explained above, or may form an integral part e.g. of a cap. The spring element may comprise one or more than one spring leaf. Most preferably, the spring element is of a coned-disk spring type which may integrate the one or more spring leaves. For instance, the one or more spring leaves of the coned-disk spring type spring element may have an end in contact with or integral with the fastener so that the spring leaf is tensioned as the fastener, such as the cap, is placed over and towards the membrane, thereby pressing the spring element against the membrane.

The spring element may even be completely independent of any secondary fastening component, such as the cap, provided it can be mounted on the vent body in a compressed state so as to provide said initial compressive force F. Thus, according to a second preferred embodiment, the tension of the spring element results from the spring element being directly secured to the body of the vent, i.e. without the above-mentioned fastener. Preferably, the spring element is secured to the body of the vent by interference fit. For instance, the spring element may comprise a circular compression member with a C-shaped or S-shaped cross section.

The membrane itself may be made from or comprise various materials. Materials suffering from creep include ePTFE, PU, PP, POM, PA, cellulose based and ceramic based materials. Polymeric materials are preferred for the present invention. These materials may be provided in different forms, e.g. as a woven, non-woven, foam or the like. Particularly preferred are membranes made from or comprising a fluoropolymer, more preferably polytetrafluoroethylene (PTFE), and most preferably expanded polytetrafluoroethylene (ePTFE). Exemplary ePTFE material may be prepared in accordance with the methods described in U.S. Pat. Nos. 3,953,566; 3,962,153; 4,096,227; 4,187,390; 4,902,423 or 4,478,665. Porous ePTFE membranes may also be prepared by other methods. Porous ePTFE comprises a porous network of polymeric nodes and interconnecting fibrils and is commercially available in a wide variety of forms from W.L. Gore & Associates, Inc., Network, Delaware, U.S.A.

As the term "ePTFE" is used herein, it is intended to include any PTFE material having a node and fibril structure, ranging from a slightly expanded structure having fibrils extending from relatively large nodes of polymeric material, to an extremely expanded structure having fibrils that nearly intersect with one another at nodal points. The fibrillar character of the structure is identified by microscope. While the nodes may easily be identified for some structures, many extremely expanded structures consist almost exclusively of fibrils with nodes appearing only as the intersection points of fibrils. The resulting micropores or voids allow for good gas or air flow while providing water resistance.

The porous polymer membrane may optionally include one or more fillers or coatings, also referred to as additives. For example, additives may be included in the matrix of the ePTFE itself. Alternatively, the porous polymeric membrane may be imbibed with an additive/solvent mixture allowing good penetration of the additive into the porosity of the film. Imbibing is accomplished by first preparing an additive/solvent solution, and then combining this solution with a porous film such as expanded FIFE. The additive may also be coated onto one or more sides of the membrane, preferably as an oleophobic coating. Desirable additives may include absorbents, adsorbents, surface energy modifiers; colorants, pigments, antimicrobials, antibacterial agents, antifungals; and mixtures thereof.

Optionally, the porous polymeric membrane may include a support layer such as a woven or non-woven fabric or fiber scrim. The support layer may be laminated, bonded or only positioned adjacent to the membrane.

The thickness of the porous polymeric membrane is not critical, but the porous polymeric membrane must be sufficiently thick to maintain a seal to the vent body by an interference fit of the clamp arrangement. Thin membranes require more precise machining and fitting of parts. Thicker membranes can be used, provided they are sufficiently permeable for effective venting. Preferably, the membrane is at least about 76 µm (3 mils) or at least about 127 µm, 254 µm, or 330 µm (5 mils, 10 mils or 13 mils) thick.

According to the second aspect of the invention, there is provided a kit for use in a vent assembly, the kit comprising the afore-mentioned porous membrane as well as the afore-mentioned spring element. The spring element has a spring constant C and a contact surface area adapted to abut the surface of the membrane in an area around a central region of the porous membrane, wherein a ratio R of the spring constant C and the total of the contact surface area A is in the range as specified above, i.e. preferably equal to or lower than 50,000 N/m/mm², more preferably equal to or lower than 15,000 N/m/mm², and most preferably equal to or lower than 1,500 N/m/mm²

Figure 1:
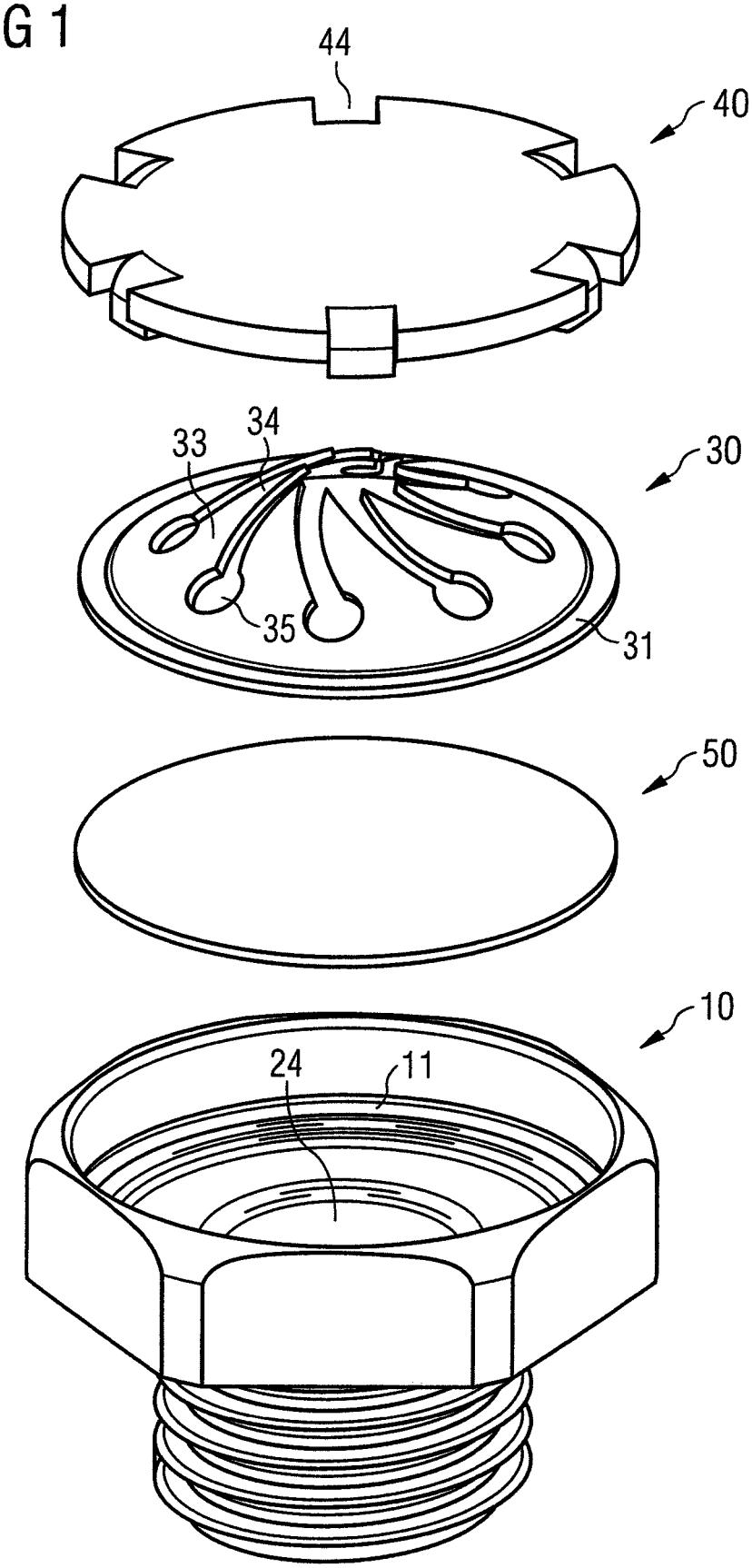
FIG. 1 is an exploded view of a vent in accordance with the present invention.

The vent as shown in FIG. 1 comprises a body 10 having an aperture 24 for the passage of a fluid, such as gas or vapor. A sealing surface 11 surrounds the aperture 24. A porous membrane 50 is provided to lie against the sealing surface 11 and cover the aperture 24. The clamp arrangement in the form of a spring element 30 and a cap 40 is provided to press the membrane 50 against the sealing surface 11 in a clamping area A of the membrane. The clamping area A of the membrane is the area in which the membrane 50 is compressed between the clamp arrangement, in this embodiment the spring element 30, and the sealing surface 11. Securing the cap 40 to the body 10 causes the spring element 30 to be sandwiched between the membrane 50 and the cap 40, thereby generating a compressive force and compressing the spring element 30.

Figure 2:
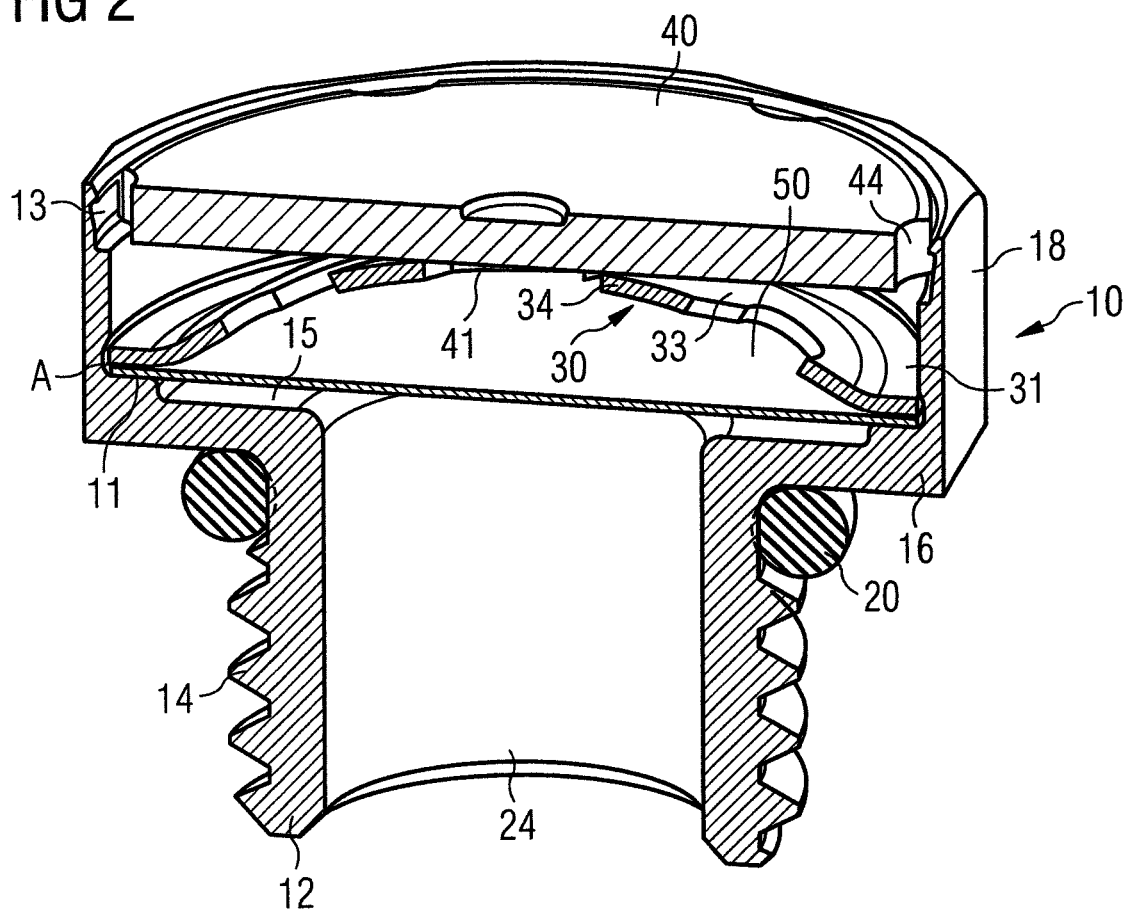
FIG. 2 is a cross-sectional view of the vent of FIG. 1 in an assembled state.

This is further shown in a cross-sectional view as depicted in FIG. 2. As can be seen, the cap 40 is snap fitted into a circumferential groove 13. Other means for securing the cap 40 of the clamp arrangement to the body 10 of the vent may include and are not limited to the following: threaded engagement, bayonet coupling, press fitting and other pure interference fits, but likewise bonding, soldering, welding and the like.

As can be seen, the height of the spring element 30 is reduced by means of the cap 40, thereby generating an axial force in the direction of the aperture 24 of the vent body 10, which force is translated into a compressive force per unit area in the clamping area. The clamping area in this case substantially corresponds to the size of the sealing surface 11. However, depending on the geometry of the membrane 50 and/or spring element 30, the clamping area may be smaller than the sealing surface 11. In the embodiment of FIG. 2, the sealing surface 11 is formed by an outer circumferential shoulder slightly protruding beyond an inner circumferential base 15, so that the central region of the membrane 50 is at a distance from the base 15. The effective area for gas and vapor transport through the pores of the porous membrane 50 therefore covers the aperture 24 and the base 15.

The spring element 30 is generally cone shaped and forms a coned-disc spring type spring element. An outer area 31 of the spring element 30 is flat and resembles a washer. It may surround the central region of the membrane 50 along a continuous line in order to seal the membrane 50 against the sealing surface 11 around the membrane's entire circumference. An inner region of the spring element 30 comprises at least one spring leaf 33, the number being eight in the embodiment shown but possibly being higher or lower. The free ends 34 of the at least one spring leaf 33 are in contact with a bottom side 41 of the cap 40 and are bent downwards in the direction of the aperture 24, thereby generating the compressive force. The compressive force is directed onto the membrane 50 via a contact surface area of the spring element 30 by which the spring element 30 abuts the surface of the membrane 50.

In an alternative embodiment, not shown, the spring element 30 may be integrally formed with the cap 40. For instance, the spring element 30 may depend from the bottom 41 of the cap 40. It may be slit in a radial, spiral or different direction so that it can build up a spring force as it is compressed by the cap 40 being secured to the vent body 10.

As stated above, the compressive force per unit area in the membrane's clamping area is sufficiently high to prevent liquid from passing through between the sealing surface 11 and the membrane 50. Due to the compressive force, the membrane has a certain thickness in the clamping area. This thickness may change during use because of various influences, such as creep and swelling. The arrangement of the vent as shown in FIGS. 1 and 2 is such that, upon a reduction of the thickness of the membrane in the clamping area by 50%, the compressive force per unit area does not change by more than 50%, preferably by more than 20%, even more preferably by more than 10%, and most preferably by more than 5%. This is achieved by the spring element 30 being chosen to have a low spring constant C and, more specifically, by choosing a ratio R of the spring constant C relative to the clamping area A smaller than 50,000 N/m/mm². More preferably, the ratio R is smaller than 15,000 N/m/mm², and even more preferably it is smaller than 1,500 N/m/mm².

Thus, if a different spring element 30 is employed, e.g. a spring element with a relatively high spring constant C, the clamping area A has to be chosen accordingly larger so as to meet the ratio R.

Figure 3:
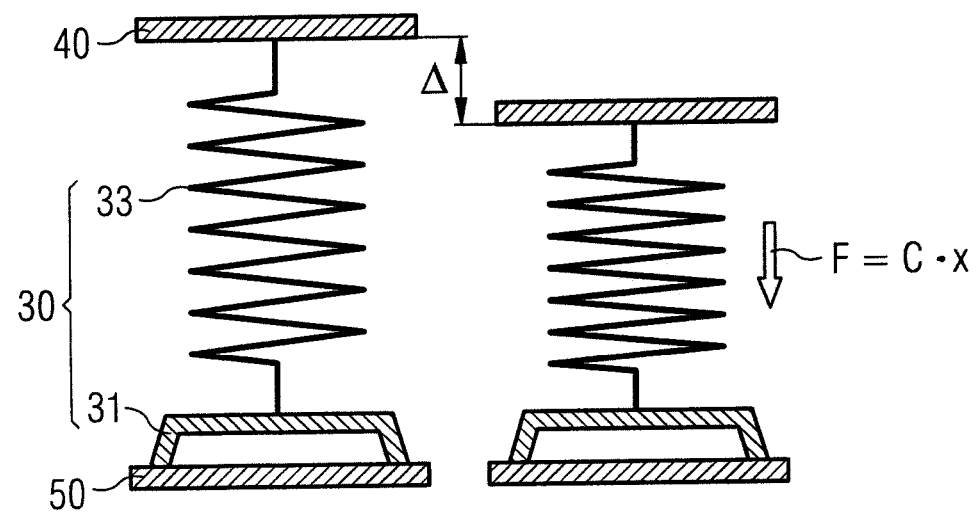
FIG. 3 is a spring model.

FIG. 3 shows the principle of the vent schematically. Accordingly, cap 40 is used to compress the spring element 30 against the membrane 50. Compressing the at least one spring leaf 33 of the spring element 30 by an amount of x causes a spring force F=C·x to be generated, the spring force F being directed via the outer area 31 of the spring element 30 onto the clamping area A of the membrane 50. Depending on the size of the contact surface area by which the outer area 31 of the spring element 30 contacts the membrane 50, the compressive force per unit area may vary.

The components of the vent are preferably made of metal, more preferably of stainless steel, such as V4A/1.4404/316L, namely, the vent body 10, the cap 40 and/or the spring element 30.

The vent body 10 includes an elongated root 12 and a flared head 16 for holding the porous membrane 50. The aperture 24 extends through the vent body from the root 12 to the head 16, providing fluid communication between the housing and the atmosphere. The root 12 may be of any shape, but typically is cylindrical to match vent holes drilled or formed into a housing. The root 12 may be tapered at its end to facilitate insertion or to permit the vent to be driven into the housing. Alternatively, threads may be cut or rolled into the outside of the root 12 which cooperate with a tapped hole in the housing. A variety of other securing mechanisms may also be incorporated into the root to retain the vent. For example, a groove may be incorporated in the root to receive a snap ring to retain the vent. Alternatively, a locking ring could be pressed onto the root after insertion into the housing. Preferably, the root is threaded 14 to match a tapped hole in the housing.

The sealing surface 11 is typically round to match the cylindrical aperture 24, but may be of any shape and size. The shape of the head 16 of the vent body is not critical. It may be cylindrical or of any shape, depending on the application. For example, the head may include a hexagonal part, as shown, so that a wrench can be used to drive a threaded vent into a tapped housing. For instance, the threading 14 on the root may be M12×1.5 and the wrench size may be 18 mm.

The aperture 24 may be machined or formed into the vent body 10 and may be straight, tapered or of any other configuration. For example, the aperture 24 may be a tapered hole, which is narrow at the root and gradually increases in diameter in the direction of the top. Alternatively, the hole diameter may increase incrementally, with the diameter at the shaft typically being narrower than at the top. The larger area near the head permits a large porous membrane to be used, which may improve venting in some applications.

The cap is preferably secured to the vent by an interference fit, as described above, and includes venting passages 44 which may be provided at its outer perimeter. There may be more or fewer than the six venting passages 44. For instance, a single venting passage 44 may be sufficient. The venting passages may be formed as holes in the cap 40 or as recesses on a circumferential surface of the cap 40, as shown, so as to form holes in cooperation with the vent body 10. The venting passages 44 may be formed in many different ways, such as by cut-outs as shown in FIG. 2, or by material deformation as shown in FIG. 1 where the venting passages 44 are formed by downwardly bent regions of the outer border of the cap 40 at a plurality of locations.

The spring element 30 as described above likewise has venting passages 35 which may be provided between the spring leaves 33. The venting passages 44 of the cap 40 and the venting passages 35 of the spring element 30 are displaced relative to each other such that liquid dripping from the venting passages 44 in the cap 40 downwards onto the spring element will not drip into the venting passages 35 of the spring element 30. More specifically, the venting passages 44 of the cap 40 are positioned radially outside the conical part of the spring element 30, and the venting passages 35 of the spring element 30 are positioned on the conical part of the spring element 30.

The width of the contact surface area of the spring element 30, which contact surface area corresponds to the clamping area A of the membrane 50 in the embodiment shown in FIGS. 1 and 2, is sufficiently large to avoid the spring element cutting into the membrane, which could lead to rapture of the membrane. Preferably, the minimum width of the contact surface area of the spring element 30 is 0.1 mm, preferably between 0.5 and 1.5 mm.

In order to allow swelling of the membrane, the outer area 31 of the spring element 30 is held in the head 16 of the vent body 10 in a non-restrained manner so that an increase of the thickness of the membrane in the clamping area by at least 50% is possible, e.g. if the membrane swells due to moisture absorption.

Preferred materials for the membrane 50 have been specified above. The size of the central area of the membrane 50 and the properties of the membrane 50 are selected such that a pressure equalization of typically 1600 ml/min @ 70 mbar pressure drop is achieved through the membrane under standard conditions. Other selections may be made depending on the specific boundary requirements.

Once assembled, the vent may be installed and sealed to a housing by any known means. Such means may include flaring, swaging, coating the threads of the shaft with sealant, or providing an O-ring around the shaft. Where an O-ring is used, it is compressed between the lower surface of the head 16 of the vent body 10 and the housing. Preferably, silicon O-rings are used. A typical O-ring may have an inner diameter of 10 mm and a cross-sectional diameter through the material of 2 mm. Silicon is preferred as a sealing material because of its large temperature range which covers typical applications between −40° C. and over 125° C.

Preferably, the vent provides ingress protection according to the standardized IP rating system regarding protection against environmental factors such as liquids and solids, preferably IP69K. Accordingly, the vent is able to resist ingress of high temperature steam and high water pressure. Burst pressures achieved with metal vents of the structure described above and loaded with spring forces of between 75 N and 150 N, respectively, were between 1.3 and 2.5 bar and between 3.3 and 3.6 bar, respectively, i.e. above these pressures water leaked between the membrane 50 and the sealing surface 11.

Figure 4:
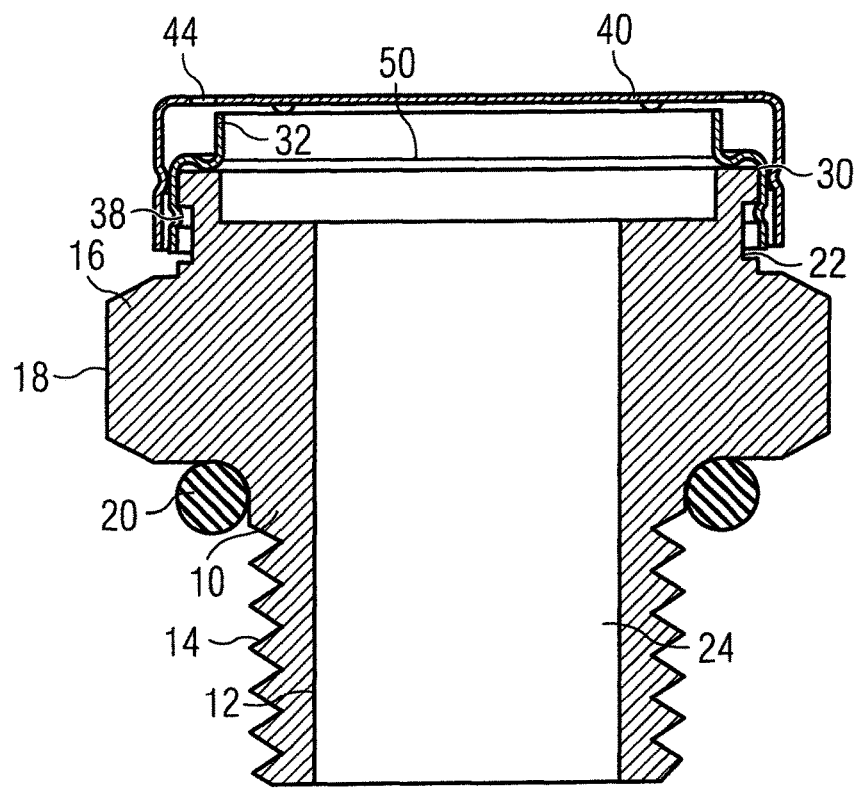
FIG. 4 is a cross-sectional view of another embodiment of a vent in accordance with the present invention.
Figure 5:
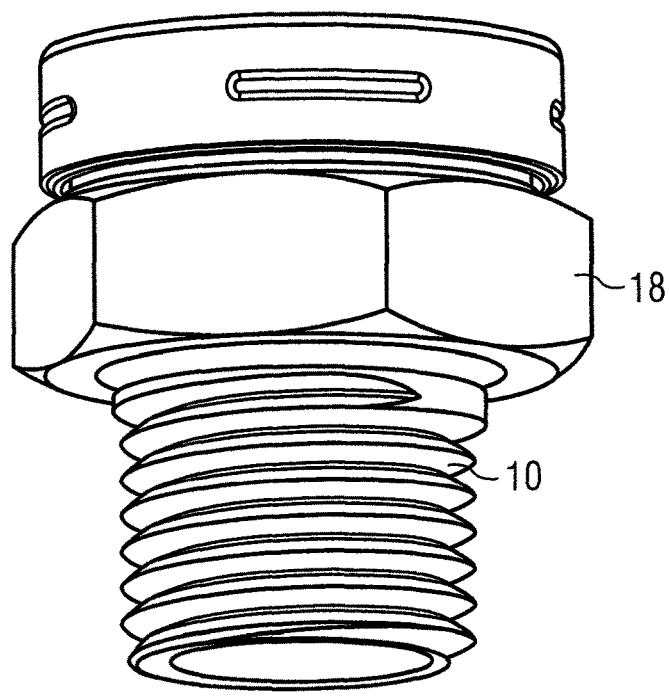
FIG. 5 is a perspective view of the vent of FIG. 4.

FIG. 4 and FIG. 5 show a different, second embodiment of a vent in cross-sectional and perspective views. The construction is identical to the construction as shown and described in relation to FIGS. 1 and 2 of EP 1 740 861 B1, and to this extent the content of EP 1 740 861 B1 is incorporated herein by reference. The vent according to this second embodiment substantially corresponds to the vent according to the embodiment described above and, therefore, like reference numerals are used for like elements. The difference between the two embodiments lies in the clamp arrangement. That is, in this second embodiment, the cap 40 does not form part of the clamp arrangement because it does not contribute to the compressive force by which the spring element 30 presses the membrane 50 against the head 16 of the vent body 10. Instead, the tension of the spring element 30 results from the spring element being directly secured to the body 10 of the vent. In this particular embodiment, a snap ring 38 formed on the spring element 30 cooperates with a groove 22 in the head 16 of the vent body 10 to secure the spring element 30 to the vent body 10. The spring element has in general a cross-sectional S-shape which includes a baffle 32 extending toward the cap 40. The sole purpose of the baffle 32 is to prevent liquid dripping from the venting passages 44 down towards the spring element 30 from reaching the membrane 50. In a different arrangement, the cross-section of the spring element would be generally C-shaped without such baffle 32.

The spring element 30 is shown only schematically. However, the spring constant C of the spring element 30 as well as the size of a contact surface area by which the spring element 30 compresses the membrane 50 against the head 16 of the vent body 10 (=clamping area) are again selected such that, upon a reduction of a thickness of the membrane 50 in the clamping area by 50%, the compressive force per unit area does not change by more than 50%.

Figure 6:
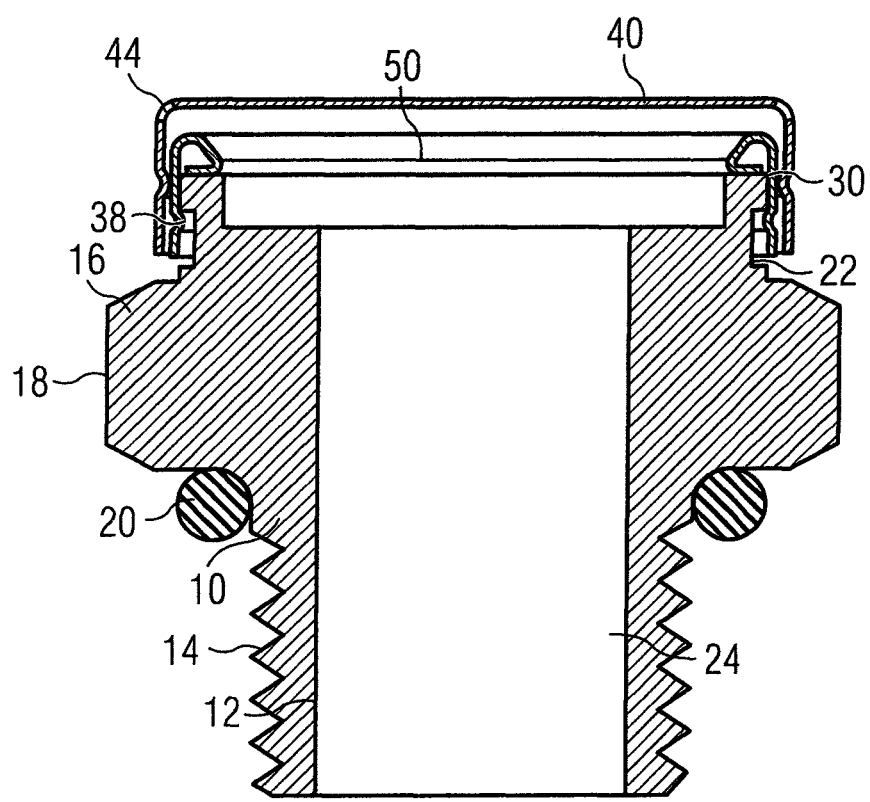
FIG. 6 is a cross-sectional view of another embodiment of a vent in accordance with the present invention.

FIG. 6 shows a third embodiment of a vent as a cross-sectional view, similar to the second embodiment shown in FIG. 4. In this third embodiment, the spring element 30 is C-shaped. The central area 31 of the spring element 30 contacting the upper surface of the membrane 50 has a substantially larger width as compared to the second embodiment of FIG. 4. Thus, the spring constant C of this spring element 30 may be chosen accordingly higher to yield the same ratio R as in the second embodiment. Due to the relatively large clamping area A, the danger of rupture of the membrane due to the spring's compressive force is reduced.

Comparative examples with spring elements having a contact surface area of about 45 mm$^2$ in combination with four spring elements having different spring constants C are given in Table 1 for an ePTFE membrane having a normal thickness of 1 mm. The initial clamping forces were chosen to achieve an initial spring compression by about 0.6 mm in three of the four examples. This yielded different surface pressure values p and different ratios R, respectively. As can be seen, a relatively soft spring element with a low spring constant C of only 57742 N/m, thus yielding a low ratio R, is sufficient to achieve a surface pressure of above 1 N/mm$^2$, here about 1.65 N/mm$^2$. But in this case it was necessary to set the initial spring compression to more than twice the value of the other comparative examples, namely 1.275 mm, to provide a sufficiently high initial force F.

TABLE 1

| Initial force F [N] | Spring compression x [mm] | Spring constant C [N/m] | Ratio R [N/m/mm$^2$] | Surface pressure p [N/mm$^2$] |
|---|---|---|---|---|
| 74 | 1.28 | 57741 | 1290 | 1.637638745 |
| 400 | 0.59 | 677966 | 15081 | 8.897550976 |
| 1350 | 0.59 | 2288136 | 50897 | 30.02923455 |
| 3150 | 0.59 | 5338983 | 118760 | 70.06821394 |

The invention claimed is:

1. A vent comprising
   (a) a body having an aperture for passage of a fluid, wherein the body further comprises a general axis;
   (b) a sealing surface surrounding the aperture,
   (c) a porous membrane covering the aperture and lying against the sealing surface, and
   (d) a clamp arrangement pressing the membrane against the sealing surface in a clamping area of the membrane with a compressive force per unit area so as to prevent a liquid from passing from the aperture through between the sealing surface and the membrane,
   wherein the clamp arrangement comprises a fastener and at least one spring element,
      wherein the at least one spring element is configured to provide the compressive force per unit area, wherein the at least one spring element comprises at least one first venting passage and at least one spring leaf,
      wherein the fastener is in a form of a cap, wherein the cap comprises at least one second venting passage, and wherein the first and second venting passages are configured to be displaced relative to each other such that liquid dripping from the at least one second venting passage of the cap towards the at least one spring element in a direction of the general axis will not drip into the at least one first venting passage of the at least one spring element;
   wherein the compressive force per unit area does not change by more than 50% upon a change of a thickness of the membrane in a clamping area (A) by 50%.

2. The vent according to claim 1, wherein the clamp arrangement allows for a decrease of the thickness of the membrane in the clamping area against the compressive force by at least 50%.

3. The vent according to claim 1, wherein the fastener is secured to the body of the vent, and wherein the compressive force per unit area results from at least one of: (i) the fastener or (ii) the spring element being secured to the body of the vent.

4. The vent according to claim 3, wherein the spring element is separate from the fastener and clamped between the fastener and the membrane.

5. The vent according to claim 3, wherein at least one of: (i) the body, (ii) at least a part of the clamp arrangement, (iii) the fastener, or (iv) the spring element is made of metal.

6. The vent according claim 1, wherein the at least one spring element has a spring constant (C), and wherein a ratio (R) between the spring constant (C) and the clamping area (A) is lower than or equal to 50,000 N/m/mm$^2$.

7. The vent according to claim 1, wherein the clamp arrangement provides a contact surface area opposite the sealing surface and abutting the membrane in the clamping area, the contact surface area having a minimum width of between 0.5 and 1.5 mm.

8. The vent according to claim 1, wherein the clamp arrangement provides a contact surface area opposite the sealing surface and abutting the membrane in the clamping area, wherein a surface pressure in the clamping area is in ranges from 1 N/mm$^2$ to 30 N/mm$^2$.

9. The vent according to claim 1, wherein the porous membrane is a polymeric membrane comprising a fluoropolymer.

10. The vent according to claim 1, wherein the membrane is secured to the body of the vent, directly or indirectly, solely by interference fit.

* * * * *